US008222053B2

(12) United States Patent
Sullivan et al.

(10) Patent No.: US 8,222,053 B2
(45) Date of Patent: Jul. 17, 2012

(54) PATTERNED ASSEMBLY FOR MANUFACTURING A SOLAR CELL AND A METHOD THEREOF

(75) Inventors: Paul Sullivan, Wenham, MA (US); Peter Nunan, Monte Sereno, CA (US); Steven R. Walther, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 308 days.

(21) Appl. No.: 12/603,707

(22) Filed: Oct. 22, 2009
(Under 37 CFR 1.47)

(65) Prior Publication Data
US 2010/0041176 A1 Feb. 18, 2010

Related U.S. Application Data

(63) Continuation of application No. 12/205,514, filed on Sep. 5, 2008.

(60) Provisional application No. 60/970,664, filed on Sep. 7, 2007.

(51) Int. Cl.
*H01L 21/00* (2006.01)
*H01L 31/00* (2006.01)
(52) U.S. Cl. .......................... 438/19; 136/249
(58) Field of Classification Search .............. 438/19, 438/96; 136/249, 258, 261
See application file for complete search history.

(56) References Cited

U.S. PATENT DOCUMENTS

| 4,086,102 A | 4/1978 | King |
| 4,140,610 A | 2/1979 | Morimoto |
| 4,187,124 A | 2/1980 | Muller et al. |
| 4,608,112 A | 8/1986 | Hufford |
| 4,667,060 A | 5/1987 | Spitzer |
| 6,184,111 B1 | 2/2001 | Henley et al. |
| 6,335,534 B1 | 1/2002 | Suguro et al. |
| 6,930,316 B2 | 8/2005 | Nishihashi et al. |
| 7,179,569 B2 | 2/2007 | Suguro et al. |
| 7,282,725 B2 | 10/2007 | Shibata et al. |
| 2004/0112426 A1 | 6/2004 | Hagino |
| 2004/0155204 A1 | 8/2004 | Kumano et al. |
| 2004/0248044 A1 | 12/2004 | Suguro et al. |
| 2006/0011582 A1 | 1/2006 | Savas |
| 2006/0258128 A1 | 11/2006 | Nunan et al. |
| 2008/0072953 A1* | 3/2008 | Stephens et al. .............. 136/249 |
| 2008/0073569 A1 | 3/2008 | Teodorczyk et al. |
| 2008/0090391 A1 | 4/2008 | Tsuchitani et al. |
| 2009/0068783 A1 | 3/2009 | Borden |

FOREIGN PATENT DOCUMENTS

| JP | 06-124673 A | 5/1994 |
| JP | 09-259779 A | 10/1997 |
| JP | 2007220707 A | 8/2007 |

OTHER PUBLICATIONS

T. Nishiwaki et al., Application of Stencil Mask Ion Implantation Technology to Power Semiconductors, Ion Implantation Technology, 2006, pp. 357-360.

* cited by examiner

*Primary Examiner* — William D Coleman

(57) ABSTRACT

Apparatuses and methods for manufacturing a solar cell are disclosed. In a particular embodiment, the solar cell may be manufactured by disposing a solar cell in a chamber having a particle source; disposing a patterned assembly comprising an aperture and an assembly segment between the particle source and the solar cell; and selectively implanting first type dopants traveling through the aperture into a first region of the solar cell while minimizing introduction of the first type dopants into a region outside of the first region.

20 Claims, 9 Drawing Sheets

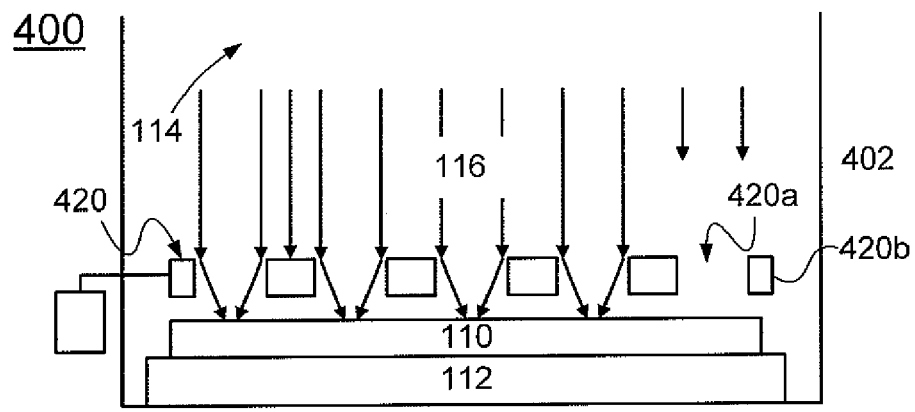
FIG. 4
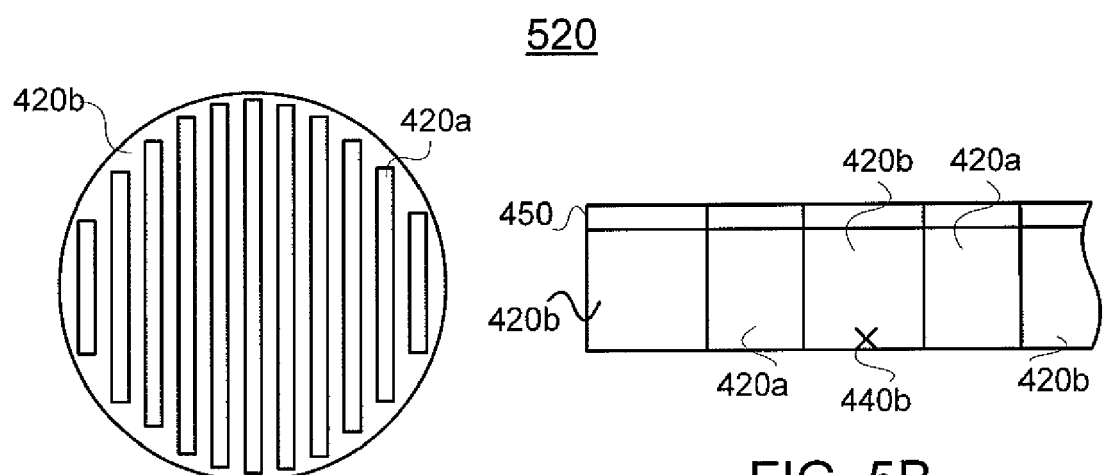
FIG 5A
FIG. 5B

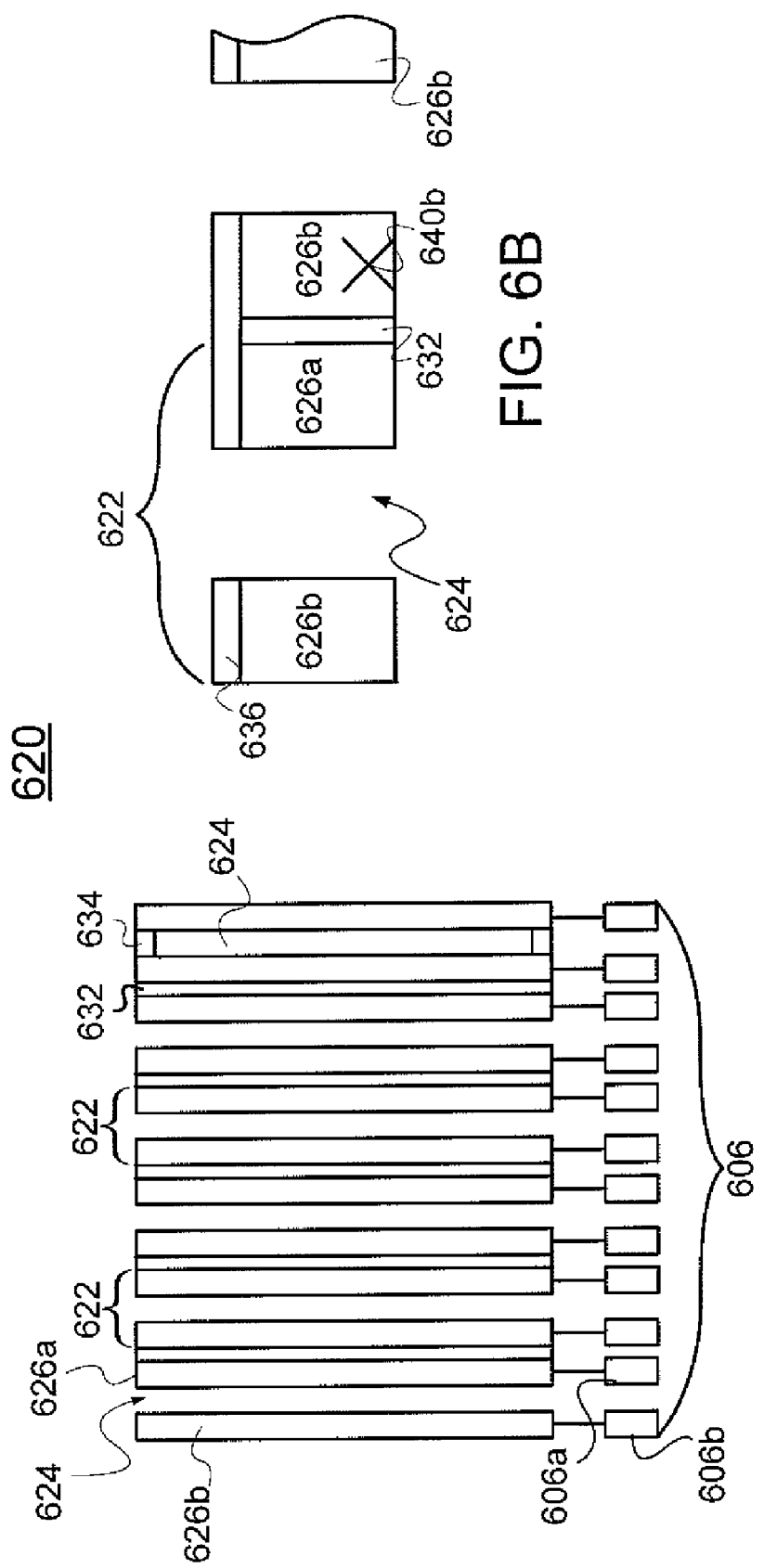

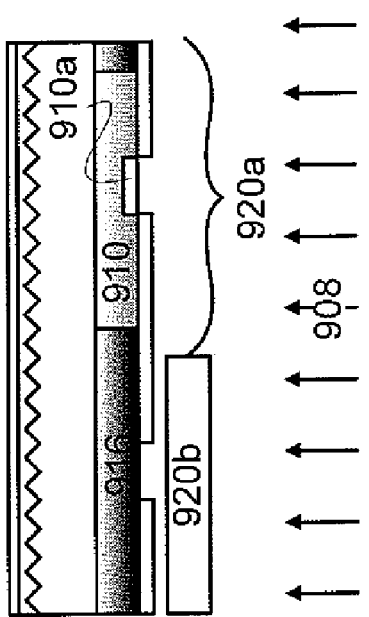
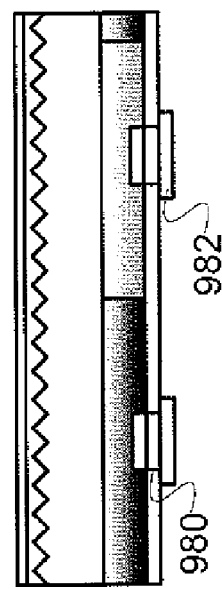
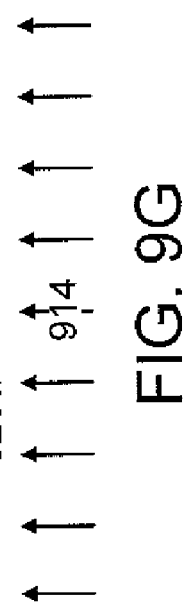

# PATTERNED ASSEMBLY FOR MANUFACTURING A SOLAR CELL AND A METHOD THEREOF

PRIORITY

This application is a continuation of U.S. application Ser. No. 12/205,514 filed Sep. 5, 2008 entitled "A Patterned Assembly for Manufacturing a Solar Cell and a Method Thereof," which claims priority to U.S. provisional patent App. No. 60/970,664 filed Sep. 7, 2007 entitled "A Patterned Charged Assembly and a System and a Method Using the Same," the disclosures of all of which are hereby incorporated herein by reference.

FIELD

This disclosure relates to a system for manufacturing a solar cell, more particularly, to a patterned assembly for manufacturing a solar cell and a method thereof.

BACKGROUND

With increase in interest in solar cells, much attention has been placed on improving the process of manufacturing the solar cells. One of sub-processes in manufacturing the solar cell may be a doping process to alter electrical and/or optical property of the solar cell. In a conventional doping process that requires patterned doping a resist or silicon dioxide ("passivating") layer, portions of the passivating layer may be removed, and portions of the solar cell may be exposed. On the exposed portions, a glass containing n-type dopants (e.g. phosphorous) may be placed. Additional portions of the passivating layer may then be removed from the surface, and another glass containing p-type dopants (e.g. boron) may be placed.

Heat may then be applied to the solar cell. With the application of heat, both n-type and p-type dopants from the glasses may diffuse into the solar cell, forming n-type and p-type doped regions. The glasses originally containing the dopant materials may then be removed.

The conventional doping process, however, is not without disadvantages. For example, the conventional solar cell manufacturing process requires the doped glasses to intimately contact the solar cell. If contaminants such as voids or air bubble are present at the glass/solar cell interface, the contaminants may hinder the doping process and/or the doping process may not form uniform doped regions.

In addition, the passivating layer and the doped glasses may be made from a material having a low melting and/or glass transition temperature. As such, excessive heat may release contaminants and introduce the contaminants to the solar cell. Moreover, excessive heat may degrade the structural integrity of the passivating layer. The contaminants and the degradation structural integrity may lead to unstable and/or non-repeatable doping condition and/or formation of non-uniform doped regions.

To prevent such disadvantages, materials having higher melting temperature, such as crystalline quartz, may be used. However, cost of the materials having higher melting temperature is very high, and use of such materials for manufacturing solar cells may be impractical. Alternatively, less heat may be applied to the solar cell. Application of less heat, however, may not provide uniform doped regions.

Another disadvantage of the conventional solar cell manufacturing process is its use of the diffusion process to form the doped regions. As known in the art, success of forming uniform doped regions may depend on parameters such as dopant concentration gradient in both of the doped glasses and the solar cell and application of uniform temperature, parameters that are difficult to control. As such, forming uniform doped regions via the conventional diffusion process may be difficult.

Yet another disadvantage of the conventional doping process may be found in the efficiency of the process. In particular, for a solar cell design requiring patterned doping, the conventional manufacturing process may require additional steps for forming the passivating layer, performing lithography and etching processes to remove portions of the passivating layer, placing the doped glasses, and performing an etching process to remove the glasses.

Such disadvantages may decrease the quality of the solar cell and/or increase the cost of manufacturing the solar cell, placing additional financial burden on the manufactures and, ultimately, the consumers. As such, improved systems and methods for manufacturing the solar cells are needed.

SUMMARY

An apparatus and a method for manufacturing a solar cell are disclosed. In a particular embodiment, the solar cell may be manufactured by disposing a solar cell in a chamber having a particle source; disposing a patterned assembly comprising an aperture and an assembly segment between the particle source and the solar cell; and selectively implanting first type dopants traveling through the aperture into a first region of the solar cell while minimizing introduction of the first type dopants into a region outside of the first region.

In another embodiment, the solar cell may be manufactured by disposing a solar cell in a chamber having a particle source; disposing a patterned assembly between the particle source and the solar cell, the patterned assembly comprising a first aperture; selectively implanting first type dopants traveling through the first aperture into a first region of the solar cell; and selectively implanting first type dopants into a second region of the solar cell, the second region positioned in an interior portion of the first region.

In another embodiment, the solar cell may be manufactured by disposing a solar cell in a chamber having a particle source; disposing a first patterned assembly between the particle source and the solar cell, the first patterned assembly comprising at least one first aperture; disposing a second patterned assembly between the particle source and the solar cell, the second patterned assembly comprising at least one second aperture; selectively implanting first type dopants through the at least one first aperture into a first region of the solar cell; and selectively implanting second type dopants traveling through the at least one second aperture into a second region of the solar cell.

In another embodiment, the solar cell may be manufactured by disposing a solar cell in a chamber having a particle source; disposing a patterned assembly between the particle source and the solar cell, the patterned assembly being spaced apart from the solar cell by a distance ranging from about 0.1 mm to about 5 cm, the patterned assembly including an aperture and an assembly segment; selectively etching a first region of the solar cell, the first region aligning with the aperture of the patterned assembly; and selectively implanting first type dopants into the first region.

In another embodiment, the solar cell may be manufactured by a system comprising: a source for generating particles; a solar cell; and a patterned assembly positioned between the source and the solar cell, the patterned assembly having an aligner, at least one aperture, and at least one assembly segment, the aligner aligning the patterned assembly and the solar cell, the aperture aligned with interior portion of the solar cell, and the assembly segment aligned with periphery of the solar cell, where a portion of the particles directed toward the solar cell passes through the aperture and reaches the interior of the solar cell and where another portion of the particles directed toward the solar cell is incident on the assembly segment and prevented from reaching the periphery of the solar cell.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, which are within the scope of the present disclosure as described herein, and with respect to which the present disclosure may be of significant utility.

BRIEF DESCRIPTION OF THE DRAWING

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 4 is a block diagram of another system for manufacturing a solar cell according to another embodiment of the present disclosure.

FIGS. 5A and 5B are plan and cross sectional view of an example of the patterned assembly shown in FIG. 4.

FIGS. 6A and 6B are plan and cross sectional view of another example of the patterned assembly shown in FIG. 4.

FIG. 9A-9H illustrate a method for manufacturing a solar cell according to another embodiment of the present disclosure.

DETAILED DESCRIPTION

Herein, several embodiments of patterned assembly for manufacturing a solar cell and a method thereof will be disclosed with reference to accompanying drawings. The detailed disclosure contained herein is intended for illustration, for better understanding the disclosure, and not a limitation thereto. Present disclosure may be made with reference to a particular solar cell manufacturing system. For example, the disclosure may be made with reference to a plasma doping ("PLAD") or a plasma immersion ion implantation ("PIII") system, or a beam-line ion implantation system. However, the present disclosure is equally applicable to other solar cell manufacturing systems including other types of plasma based or non-plasma based doping systems, plasma based or non-plasma based etching systems, plasma based or non-plasma based deposition systems, and the sprayed wet chemistry systems.

In addition, specific reference to a particular system does not mean that the system is limited thereto. For example, disclosure with reference to the beam-line system does not mean that the system is not applicable to the PLAD of PIII system. Further, different embodiments of the present disclosure may contain features that are similar to one another. For purpose of clarity and simplicity, a detailed description of the similar features is omitted.

Figure 1:
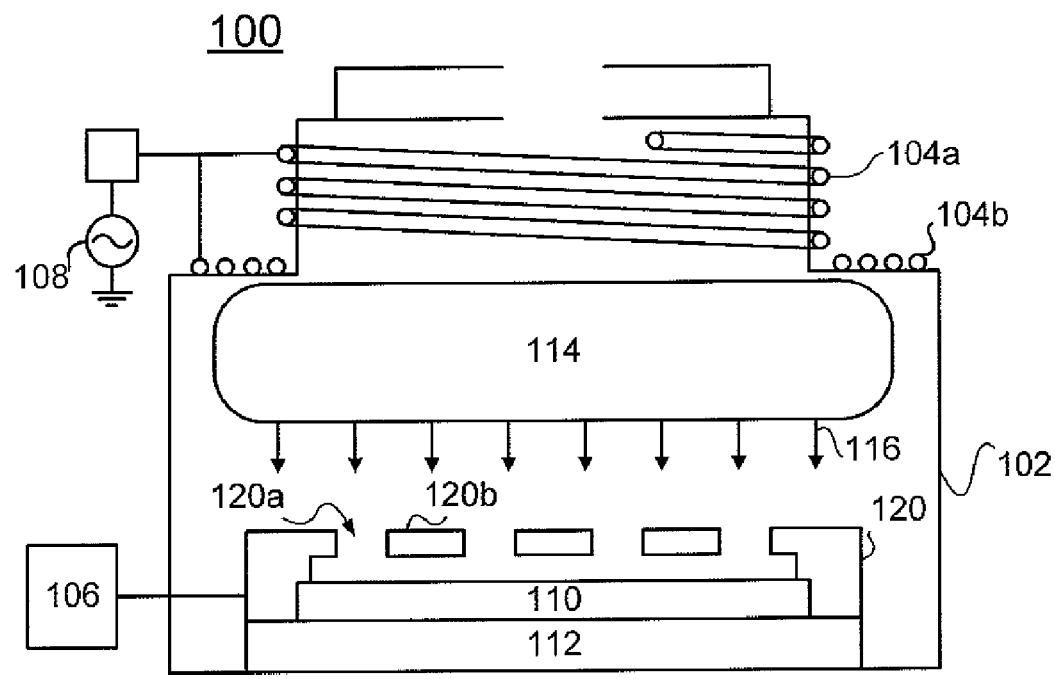
FIG. 1 is a block diagram of a system for manufacturing a solar cell according to one embodiment of the present disclosure.

Referring to FIG. 1, there is shown a system 100 for processing a solar cell according to one embodiment of the present disclosure. In the present embodiment, the system 100 may be a PLAD or PIII system; other plasma based system such as plasma etching or deposition systems; or other non-plasma based systems. The system 100 may comprise a chamber 102; a plurality of antennas 104a and 104b; and first and second power sources 106 and 108. In the chamber 102, a solar cell 110; a platen 112; a particle source 114 containing particles 116; and a patterned assembly 120 may be disposed. Meanwhile, the patterned assembly 120 may comprise at least one aperture 120a for introducing the particles 116 to the solar cell 110 and at least one assembly segment 120b for preventing the particles 116 from being introduced to the solar cell 110.

In the present disclosure, the particles 116 may be charged or neutral, atomic, sub-atomic, or molecular particles. Examples of the particles 116 may include electrons; protons; neutrons; helium atoms or ions; fluorine containing atoms, molecules, or ions; phosphorous containing atoms, molecules, or ions; boron containing atoms, molecules, or ions; and any other atoms, molecules, or ions. Examples of the particles 116 may also include other molecular ions or clusters. In addition, the particles 116 may be in gas, liquid, or solid state. Examples of particles in liquid state may be chemicals in vapor or liquid state, such as liquid etchant. As such, the present disclosure is not limited to the types of particles or state of the particles.

Such particles 116, in the present disclosure, may be generated or contained in the particle source 114. Examples of the particle source 114 may include gas, liquid, solid (e.g. physical vapor deposition source), and plasma containing the particles 116. Those of ordinary skill in the art will recognize that the present disclosure is not limited to a particular type of particle source.

In the present disclosure, the solar cell 110 may be any type of solar cell 110 capable of converting incident radiation energy into electrical energy. The solar cell in the present disclosure may be, for example, doped or undoped semiconductor including silicon ("Si"), gallium arsenide ("GaAs"), gallium selenide ("GaSe"), zinc selenide ("ZnSe"), gallium nitride ("GaN"), cadmium telluride ("CaTe"), indium phosphide ("InP"), copper indium diselenide ("CuInSe$_2$"), copper indium gallium selenide ("CuIn$_x$Ga$_{(1-x)}$Se$_2$," or "CIGS"). The solar cell 110 may also be an organic solar cell or a combination of semiconductor or organic solar cell. Further, the solar cell of the present disclosure may have a crystalline structure; poly-crystalline or micro-crystalline structure; amorphous structure; and a combination thereof.

As illustrated in FIG. 1, the aperture 120a may be located anywhere in the patterned assembly 120. In one embodiment, the aperture 120a may be located at interior portion of the patterned assembly 120, between two assembly segments 120b. In another embodiment, the aperture 120a may be located at the periphery of the patterned assembly 120. Yet in another embodiment, the patterned assembly 120 may comprise at least one aperture 120a located at the interior of the patterned assembly 120 and at least one aperture 120a located at the periphery of the patterned assembly 120. Thus, the location of the aperture 120a is not limited merely to the locations illustrated in FIG. 1.

In the present disclosure, the antennas 104a and 104b may be a part of particle manufacturing source such as, for example, an inductively coupled plasma source, a helicon source, or a microwave source. Although the figure illustrates two antennas 104a and 104b, those of ordinary skill in the art will recognize that the system may comprise only one of the antennas 104a and 104b. In addition, those of ordinary skill in the art will recognize that even if the system 100 comprises both antennas 104a and 104b, only one of the antennas 104a and 104b may be powered during generation of the particles. If powered, at least one of the antennas 104a and 104b may be applied with constant or pulsed DC or RF current.

As illustrated in FIG. 1, the patterned assembly 120 may be positioned between the particle source 114 and the solar cell 110. In the present embodiment, the patterned assembly 120 and the solar cell 110 may be supported by the platen 112. In another embodiment, at least one of the solar cell 110 and the patterned assembly 120 may be supported by a holder (not shown) other than the platen 112. In another example, at least one or both of the solar cell 110 and the patterned assembly 120 may be supported by the chamber wall.

In one embodiment, the assembly segment 120b of the patterned assembly 120 may be spaced apart from the upper surface of the solar cell 110. If spaced apart, the distance between the assembly segment 120b and the solar cell 110 may range from about 0.1 mm to about 5 cm. If a surface layer (e.g. dielectric layer) is formed on the solar cell 100, the distance may increase by the thickness of the surface layer. Alternatively, the distance may remain the same, and a thin surface layer may be disposed. In another embodiment, the assembly segment 120b may directly contact the solar cell 110 or the formed layer.

As illustrated in FIG. 1, the patterned assembly 120 may be coupled to the first power source 106, whereas one or both of the antennas 104a and 104b and the solar cell 110 may be coupled to the second power source 108. In another embodiment, the solar cell 110 may be coupled to the first power source 108. Yet in another embodiment, one or both of the antennas 104a and 104b, the patterned assembly 120, and the solar cell 110 may be coupled to one of the first and second power sources 106 and 108. Yet in another embodiment, the system 100 may comprise a third power source (not shown), and the patterned assembly 120, one or both of the antennas 104a and 104b, and the solar cell 110 may be coupled to different power sources.

In the present embodiment, one of the patterned assembly 120 and the solar cell 110 may be biased, whereas the other one of the patterned assembly 120 and the solar cell 110 is electrically floating. In another embodiment, one of the patterned assembly 120 and the solar cell 110 that is not biased may be grounded. In other embodiments, both of the patterned assembly 111 and the solar cell 110 may be biased; electrically floating; or grounded. If biased, the patterned assembly 120 and/or the solar cell 110 may be directly biased or indirectly biased via another component, for example, the platen 112.

If biased, the voltage applied to the patterned assembly 120, the solar cell 110, or both may be positive or negative voltage. If both are biased, the patterned assembly 120 and the solar cell 110 may be biased with identical or opposite voltages. In addition, the voltage applied to both the patterned assembly 120 and the solar cell 110 may have identical or different values.

If current is applied to the patterned assembly 111, the solar cell 110, or both, the current may be a pulsed or continuous DC or RF current. If the pulsed current is applied to both of the patterned assembly 120 and the solar cell 110, the pulses may be synchronized. For example, the pulse frequency, the pulse duration, the pulse amplitude, and/or timing of the pulses may be synchronized. The pulsed current may also be synchronized to the pulsed DC or RF current applied to at least one of the antennas 104a and 104b of the system 100.

In operation, the particle source 114 may contain the particles 116. As noted above, the particles 116 may be generated by powering at least one of the antennas 104a and 104b. Meanwhile, the patterned assembly 120, the solar cell 110, or both may be biased. Depending on the applied voltage, each of the patterned assembly 120 and the solar cell 110 may act as an anode or a cathode, and the particles 116 may be attracted toward or repelled from the patterned assembly 120.

As illustrated in FIG. 1, a portion of the particles 116 traveling toward the solar cell 110 may be transmitted through at least one aperture 120a, whereas another portion of the particles 116 may be blocked by the patterned assembly segment 120b. The transmitted particles 116 may then be introduced to the solar cell 110. As such, the region of the solar cell 110 introduced with the particles 110 may be defined by the aperture 120a of the patterned assembly 120.

If the particles are charged particles, the energy of the particles 116 introduced into the solar cell 120 may range from about 3 KeV to about 800 KeV. In addition, the current of the particles may be 2 mA or above. The dose of the particles may be about $1 \times 10^{14}/cm^2$ to about $1 \times 10^{17}/cm^2$. However, those of ordinary skill in the art will recognize that the energy, current, and dose may have other values.

If the particles 116 are implanted into the solar cell 110, the particles 116 may form a doped region. Depending on the type of particles 116 and the solar cell 110, different types of doped regions may form. For example, n-type particles 116 (e.g. particles containing phosphorous) may be implanted into the solar cell 110 to form an n-type region. In another example, p-type forming particles (e.g. particles containing boron) may be implanted into the solar cell 110 to form a p-type doped region. In the present disclosure, if both types of particles are implanted, the dose of the particles implanted into different regions may be the same or different such that the implanted regions may have the same or different dopant or carrier concentration. In addition, if both types of particles are implanted into adjacent regions of the solar cell 110, a p-n junction may be formed. By implanting different dopants via the patterned assembly 120, highly resolved p-n junction may be formed. In the process, isotropic diffusion prevalent in the conventional solar cell manufacturing process may be minimized. In addition, if multiple p-n junctions are desired, uniform p-n junctions may be formed.

In addition to the p-n junction, one or more of contact regions may be formed. For example, n-type dopants may be implanted into an interior portion of existing n-type doped region such that the newly implanted portion may have higher n-type dopant or carrier concentration and n-type conductivity. Conversely, the p-type dopants may be implanted into an interior of existing p-type doped region such that the newly implanted portion may have higher p-type dopant or carrier concentration and p-type conductivity. The newly formed n-type and p-type implanted portions may then serve as contact regions. The contact regions may be highly resolved and uniform. Such highly resolved and uniform contact regions may not be possible via the conventional doping process that involves isotropic diffusion.

Figure 2:
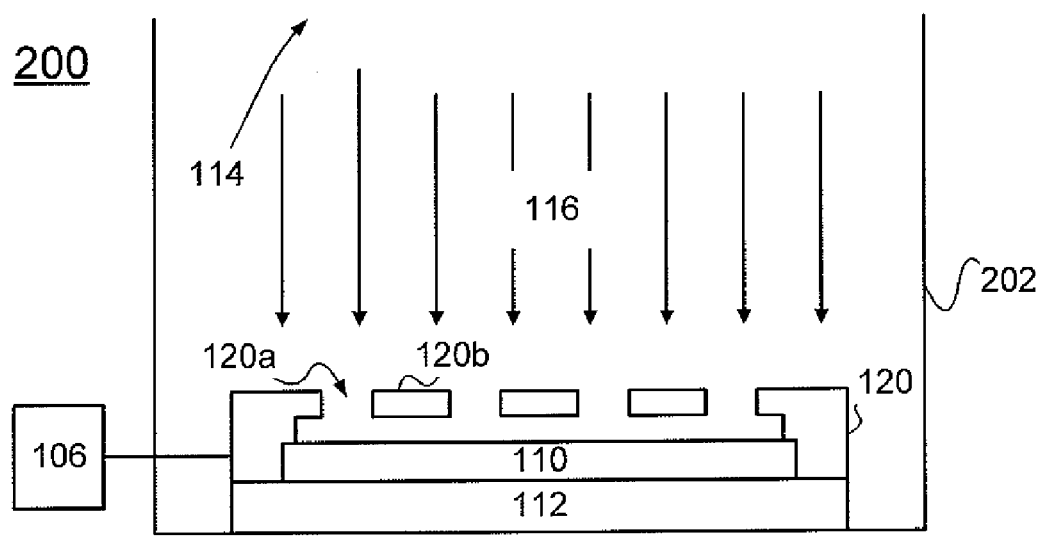
FIG. 2 is a block diagram of another system for manufacturing a solar cell according to another embodiment of the present disclosure.

Referring to FIG. 2, there is shown another system 200 according to another embodiment of the present disclosure. In the present embodiment, the system may be a beam-line ion implantation system or a wet chemistry system for processing the solar cell. The system 200 may comprise a chamber 202 and a power source 106. In the chamber 202, the solar cell 110; the platen 112; the particle source 114 containing the particles 116; and the patterned assembly 120 may be disposed. The patterned assembly 120 may have at least one aperture 120a and at least one assembly segment 120b. For purpose of clarity and simplicity, description of features that are similar to those described in earlier embodiments may be omitted.

In one embodiment, the assembly segment 120b of the patterned assembly 120 may be spaced apart from the upper surface of the solar cell 110. If spaced apart, the distance between the assembly segment 120b and the solar cell 110 may range from about 0.1 mm to about 5 cm. If a surface layer (e.g. dielectric layer) on the solar cell is necessary, the distance may increase by the thickness of the surface layer. Alternatively, the distance may remain the same, and a thin surface layer may be disposed. In another embodiment, the assembly segment 120b may directly contact the solar cell 110 or the surface layer.

If the system 200 is a beam-line ion implantation system, the system 200 may also include a cathode, an indirectly heated cathode ("IHC"), a Freeman source, a Bernas source, an electron or ion flood gun for generating the particles 116. In addition, the system 200 may also include one or more beam-line components (not shown) capable of manipulating the particles 116 in a beam-like state and direct the particles to the solar cell 110.

The patterned assembly 120 in one embodiment may be grounded. Alternatively, the patterned assembly 120 and the solar cell 110 may be electrically floating or biased. If biased, the patterned assembly 120 and/or the solar cell 110 may be coupled to the power source 106. Alternatively, the system 200 may further comprise a second power source (not shown), and the solar cell 110 and the patterned assembly 120 may be coupled to different power sources.

In operation, the system 200 may generate the particles 116 contained in the particle source 114. Thereafter, the system 200 may direct the particles 116 from the particle source 114 toward the patterned assembly 120 in a beam-like state. In the present embodiment, the energy of the particle beam may range from about 3 KeV to about 800 KeV. Meanwhile, the current of the beam may be 2 mA or above. Concentration or dose of the charged particles meanwhile may be about $1\times10^{14}$ to about $1\times10^{17}/cm^2$. However, those of ordinary skill in the art will recognize that the energy, current, and dose may have other values.

As illustrated in FIG. 2, a portion of the particles 116 directed toward the solar cell may be implanted into the solar cell 110 via the aperture 120a, whereas another portion of the particles 116 may be prevented from being implanted into the solar cell 110. With the patterned assembly 120, highly resolved and uniform doped regions, p-n junctions, and/or contact regions, which may not be possible with conventional diffusion based manufacturing process, may be formed.

If the system 200 is a wet chemistry system for processing the solar cell 110, the particle source 114 may contain particles 116 in liquid state for processing the solar cell. In operation, the patterned assembly 120 may be disposed between the particle source 114 and the solar cell 110. The solar cell 110 may be coated with a dielectric or photoresist layer (not shown). Alternatively, the solar cell 110 may be without any layer formed on the surface. Thereafter, the particles 116 or liquid chemicals may be directed toward the solar cell 110. The particles 116 may then process (e.g. etch) selected region or regions of the solar cell 110 or, if present, the surface layer that are aligned with the aperture 120a of the patterned assembly 120.

Referring to FIG. 3A-3D, there are shown plan and cross sectional views of several examples of the patterned assembly 120 shown in FIGS. 1 and 2. In the present disclosure, the assembly 120 may be made from a material or combination of materials having high melting and/or glass transition temperature. Examples of the material or materials may include silicon; carbon; boron; aluminum; quartz; other metals or metal alloys; other dielectric having high melting and/or glass transition temperature; and other single or compound semiconducting materials.

Figure 3A:
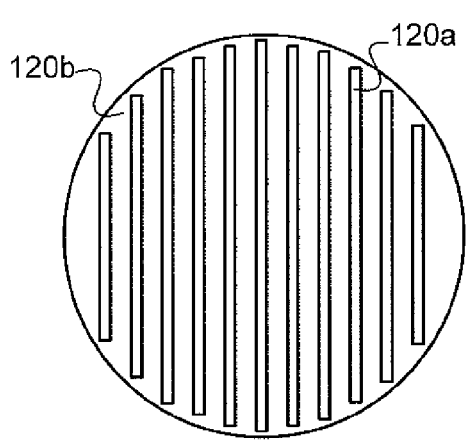
FIG. 3A-3D are plan and cross sectional views of several examples of the patterned assembly shown in FIGS. 1 and 2.
Figure 3B:
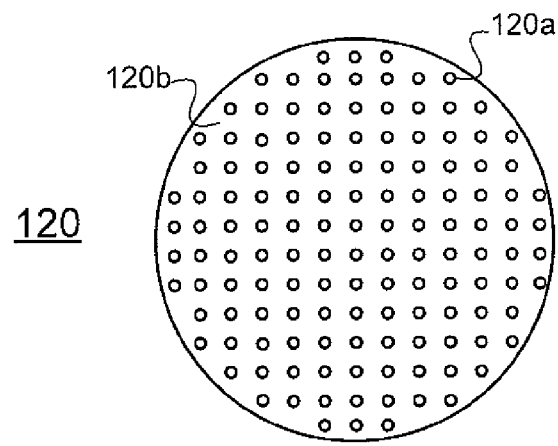
Figure 3C:
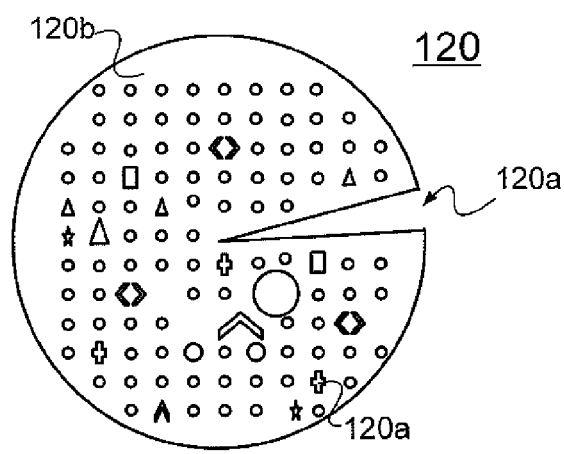

As illustrated in FIG. 3A-C, plan views of the pattern assembly 120, the assembly 120 may have a circular shape. Alternatively, the assembly 120 may have rectangular, pentagonal, hexagonal, octagonal, or other polygonal shape. In addition, the assembly 120 may have one or more one or more rectangular apertures, as shown in FIG. 3a; one or more circular apertures, as shown in FIG. 3b; one or more triangular, chevron, or wedge shaped apertures, as shown in FIG. 3c; or a combination thereof. Those of ordinary skill in the art will recognize that the apertures of the assembly 120 may have other shapes. If the assembly 120 comprises a plurality of apertures 120a, the apertures 120a may have the same or different shapes and/or the same or different sizes. In addition, the apertures 120a may be spaced apart from one another by the same or different distances.

Figure 3D:
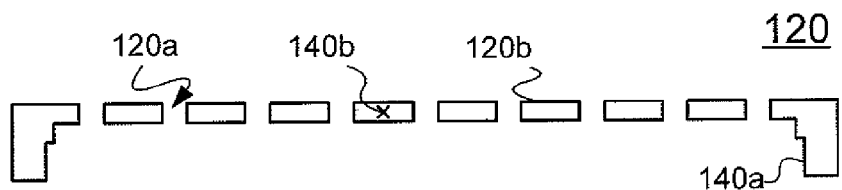

As illustrated in FIG. 3D, the cross sectional view, the assembly 120 may also comprise a solar cell aligner 140 that may orient the assembly 120 and the solar cell in a desired orientation. The patterned assembly aligner 140 may be an edge 140a that is in contact with entire or a portion of the side surface of the solar cell 110. The patterned assembly aligner 140 may also be one or more registration point 140b that communicates with one or more registration points of the solar cell to align the patterned assembly 120 and the solar cell 110 in a desired orientation.

Referring to FIG. 4, there is shown a system 400 according to another embodiment of the present disclosure. The system 400 may comprise the chamber 402 and a power source (not shown). In the chamber 402, the solar cell 110; the platen 112; the particle source 114 containing the particles 116 may be disposed. In addition, a patterned assembly 420 having at least one aperture 420a and at least one assembly segment 420b may be disposed. As illustrated in FIG. 4, the system 400 of the present embodiment may have several features that are similar to those included in the systems 100 and 200 described in the earlier embodiments. For purposes of clarity and simplicity, description of features that are similar to those described in earlier embodiments may be omitted.

In the present embodiment, the patterned assembly 420 may be disposed such that the distance between the assembly segment 420b and the solar cell 110 along a vertical direction may preferably range between about 5 cm to about 10 cm. If a surface layer (not shown) is necessary, the distance between the assembly segment 420b and the solar cell 110 may be increased by the thickness of the surface layer. Alternatively, the distance may remain the same, and a thin surface layer may be disposed.

In operation, the patterned assembly 420 may be positioned between the particle source 114 and the solar cell. The particles 116 contained in the particle source 114 may then be directed toward the solar cell 110. Meanwhile, the patterned assembly 420 may be biased by the power source 106. A portion of the particles 116 directed toward the solar cell 110 may be incident on the assembly segments 420b and prevented from being implanted into the solar cell 110. Meanwhile, another portion of the particles may be implanted into the solar cell 110 as they pass through the apertures 420a. As illustrated in FIG. 4, the particles 116 entering the apertures 420a may be influenced by the electrostatic force applied by the assembly 420, and the trajectory of the particles 116 may change. Depending on the charge of the particles 116 and the type and magnitude of the bias applied to the assembly 420, the assembly may focus the particles 116. As such, the patterned assembly 420 may improve the resolution of the particles 416 introduced to the solar cell 410.

Referring to FIG. 5A-5B, there are shown plan and cross sectional views of the patterned assembly 420 incorporated into the system 400. In addition to at least one aperture 420a and at least one patterned assembly segment 420b, the assembly 420 may comprise a solar cell aligner 440 located anywhere in the assembly 520 for aligning the patterned assembly 420 and the solar cell (not shown) in a desired orientation. In the present embodiment, the solar cell aligner 440 may be an edge (not shown) that is in contact with the entire or a portion of the side surface of the solar cell. The solar cell aligner 440 may also be a registration point 440b that communicates with the solar cell or the registration point of the solar cell to align the patterned assembly 420 and the solar cell in a desired orientation.

The patterned assembly 420 may optionally comprise at least one insulating layer 450 disposed on at least one surface of the patterned assembly 420. If present, the insulating layer 450 may limit the influence of the patterned assembly 420 on the trajectory of the particles until the particles enter the aperture 420a of the assembly.

Referring to FIGS. 6A and 6B, there are shown plan and cross sectional views of another patterned assembly 620 that may be incorporated into the system 400. The patterned assembly 620 may comprise one or more patterned assembly units 622. The unit 622 may comprise first and second patterned assembly segments 626a and 626b and an aperture 624 positioned between the segments 626a and 626b. If the patterned assembly 620 comprises a plurality of the patterned assembly units 622, the patterned assembly units 622 may be spaced apart from one another by a first insulating segment 632 positioned between adjacent patterned assembly units 622. As illustrated in FIG. 6B, the patterned assembly 620 may also comprise a solar cell aligner 640 positioned at any location of the patterned assembly 620. The solar cell aligner 640 may be an edge (not shown) that is in contact with the entire or a portion of a side surface of the solar cell (not shown), and orient the solar cell in a desired orientation. Alternatively, the solar cell aligner may be a registration point 640b that communicates with one or more registration point of the solar cell.

The patterned assembly 620 may optionally comprise a second insulating segment 634 disposed near the aperture 624 that separates the first and second patterned assembly segments 626a and 626b. In addition, the patterned assembly 620 may comprise an optional third insulating layer 636 disposed on at least one surface of the patterned assembly 620. The third insulating layer 636 may limit the influence of the patterned assembly 620 on the trajectory of the particles until the particles enter the aperture 624.

As illustrated in FIG. 6A, the patterned assembly 620 may be coupled to a power source unit 606. The power source unit 606 may comprise a power sources coupled to each unit 606. Alternatively, the power source unit 606 may comprises a plurality of power sources 606a and 606b coupled to each segment 626a and 626b.

In operation, the first and second patterned assembly segments 626a and 626b may be biased by the power sources 606a and 606b of the power source unit 606. In the present embodiment, different patterned assembly units 622 may be applied with identical or opposite voltages. If different patterned assembly units 622 are biased with opposite voltages, the patterned assembly units 622 may function as adjustable gates, selectively transmitting the particles based on the charge of the particles. For example, one assembly units 622 may be biased with a positive voltage while another assembly unit 622 may be biased with negative voltage. The assembly unit 622 biased with negative voltage may transmit positively charged particles through the aperture 624 of the unit 622 while preventing negatively charged particles from passing through. As such, undesired charged particles may be prevented from being implanted into the solar cell.

Figure 7:
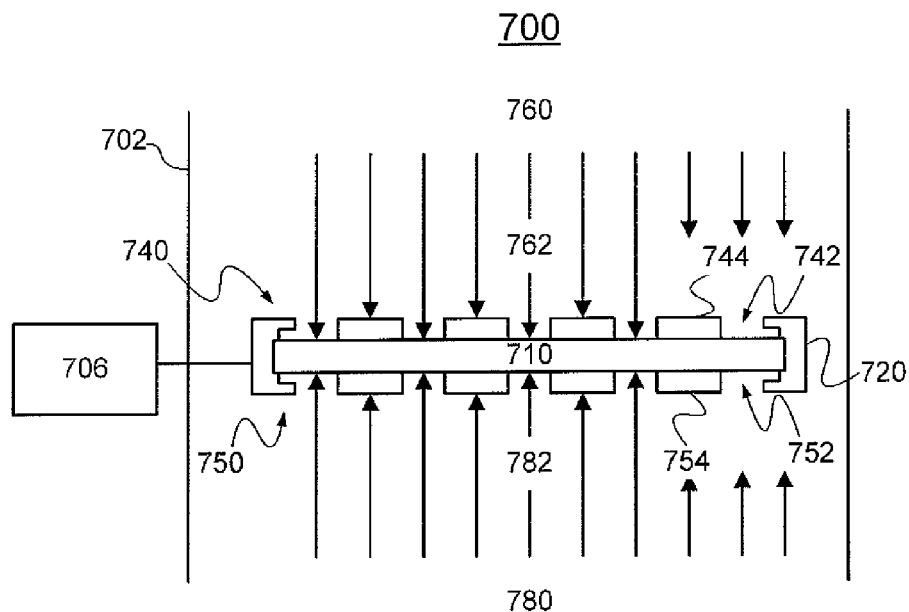
FIG. 7 is a block diagram of another system for manufacturing a solar cell according to another embodiment of the present disclosure.

Referring to FIG. 7, there is shown a system 700 according to another embodiment of the present disclosure. The system 700 may comprise the chamber 702 and a power source unit 706. The chamber 702 may contain a solar cell 710; a patterned assembly 720; and first and second particle source 760 and 780 for containing first and second particles 762 and 782. The patterned assembly 720 may comprise first and second portions 740 and 750. Each portion 740 and 750 may have at least one aperture 742 and 752 and at least one patterned assembly segment 744 and 754. The locations of the apertures 742 and 752 may not be the same for each portion 740 and 750 in one particular embodiment. As illustrated in FIG. 7, the system 700 of the present embodiment comprises many features that are similar to those disclosed earlier. For purpose of clarity and simplicity, description of similar features may be omitted.

In the present embodiment, the first and second particles 762 and 782 may be the same type of particles or, alternatively, different types of particles. For example, first and second particles 762 and 782 may be different ions. In another example, the first particle 762 may be ions, whereas the second particle 782 may be liquid etchant.

In the present embodiment, the solar cell 710 may be a single solar cell 710. In another embodiment, the solar cell 710 may be a plurality of solar cells 710 proximate to one another. For the purpose of simplicity, the solar cell 710 will be referred hereinafter as a single solar cell 710.

In operation, particles 762 and 782 from each particle source 760 and 780 may be directed toward the solar cell 710. Thereafter, a portion of the particles 762 and 782 may be transmitted through the apertures 742 and 752 of the first and second patterned assembly portions 740 and 750 and implanted into the solar cell 710. In the process, the system 700 may manufacture more than one surface of the solar cell 710 or manufacture multiple solar cells 710. The system 700, therefore, may have greater manufacturing efficiency.

Figures 8A, 8B:
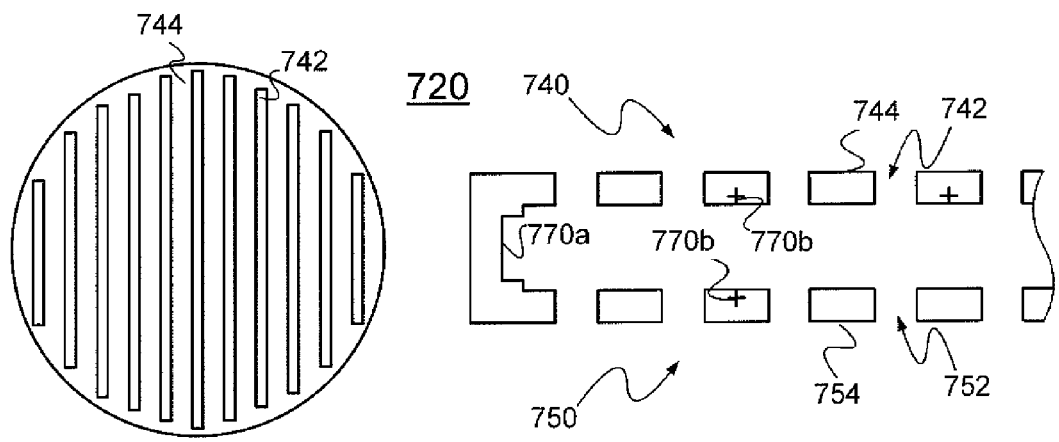
FIGS. 8A and 8B are plan and cross sectional views of an example of the patterned assembly shown in FIG. 7.

Referring to FIGS. 8a and 8b, there are shown plan and cross sectional views of an example of the patterned assembly 720 shown in FIG. 7. In addition to having the first and second portions 740 and 750 and at least one aperture 742 and 752 and at least one patterned assembly segment 744 and 754 on each portion 740 and 750, the patterned assembly 720 may also comprise a solar cell aligner 770 that aligns the patterned assembly 720 and the solar cell in a desired orientation. As illustrated in FIG. 8, the cross sectional view, the solar cell aligner 770 may include an edge 770a that is in contact with the entire or a portion of a side surface of the solar cell. The solar cell aligner 770 may also include at least one registration point 770b that communicates with one or more registration point the solar cell.

Referring to FIG. 9A-H, there is shown a method for manufacturing a solar cell according to one embodiment of the present disclosure. In the present embodiment, the process of manufacturing the solar cell may include steps for forming/processing (1) a p-n junction, (2) a radiation receiving surface, and (3) a contact region, not necessarily in such order.

Hereinafter, steps for forming a p-n junction or a plurality of p-n junctions on a solar cell 900 are provided. In the present embodiment, the solar cell may be an n-type solar cell. However, in another embodiment, the solar cell may be p-type solar cell. Yet in another embodiment, the solar cell may be an undoped, neutral solar cell. In addition, the solar cell may preferably be a Si solar cell. However, in other embodiments, the solar cell may be other types of solar cell. Further, the solar cell may have single crystal, poly-crystal, or amorphous solar cell.

Figure 9A:
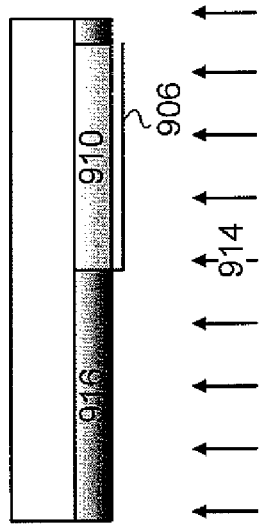

As illustrated in FIG. 9A, a surface layer 906 may be formed on the lower surfaces 904 of the solar cell 900. In the present disclosure, the surface layer 906 may comprise, polymeric, inorganic, ceramic, or metallic layer, or a combination thereof, such as, a passivation layer, dielectric layer, a hard mask, a metallic layer, a photoresist layer.

Thereafter, a portion of the surface layer 906 formed on the lower surface 904 may be removed. In one embodiment, the portion may be removed via lithographic and etching processes. In another embodiment, the portion may be removed by disposing a patterned assembly (not shown) near the surface layer 906. Thereafter, particles capable of removing the surface layer may selectively be introduced via the aperture of the assembly and remove the portion of the surface layer 906. After removing the portion of the surface layer 906, p-types particles 908 may be introduced into the exposed portion of the solar cell 900. In the process, a p-type region 910 may be formed. The surface layer 906 may then be formed on the p-type region 910 such that the entire lower surface 904 may be covered with the surface layer 906.

Figure 9B:
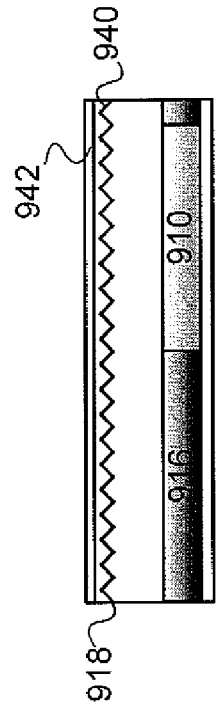

As illustrated in FIG. 9B, the region(s) adjacent to the p-type region 912 may then be exposed as the surface layer 906 may be removed from the adjacent region(s). After removing the surface layer 906, n-type particles 914 may be introduced to the exposed adjacent region(s). In the process, the n-type region(s) 916 may be formed adjacent to the p-type region 910, thus forming a p-n junction. In the present disclosure, the dose of the n-type particles introduced to form the n-type region 916 may be less than, equal to, or greater than the dose of the p-type particles introduced to form the p-type region 910. As such, the n-type region 916 may have equal or different particle or carrier concentration than the p-type region 910.

In the present embodiment, the p-type region 910 may preferably be formed prior to the forming the n-type region 916. However, in another embodiment, the p-type region 910 may be formed after forming the n-type region 916. In addition, the particles may be introduced in the present embodiment via implantation process. Implantation of the particles may be preferable as the process may minimize isotropic diffusion. However, in another embodiment, the particles may be introduced via a diffusion process. Yet in another embodiment, one type of particles may be introduced via implantation process, whereas another type of particles may be introduced via diffusion process. In introducing the particles, via implantation process or diffusion process, the patterned assembly of the present disclosure may be used instead of or in addition to the surface layer to selectively introduce the particles.

Hereinafter, steps for forming the surface for receiving radiation are provided. In the present embodiment, the surface layer 906 may be formed on the upper and lower surfaces 902 and 904 of the solar cell 900. Thereafter, the surface layer 906 may be removed exposing the upper surface 902. The exposed upper surface 902 may preferably be anisotropically etched with particles capable of etching a surface, for example, KOH, to form a plurality of grooves 918.

Figure 9C:
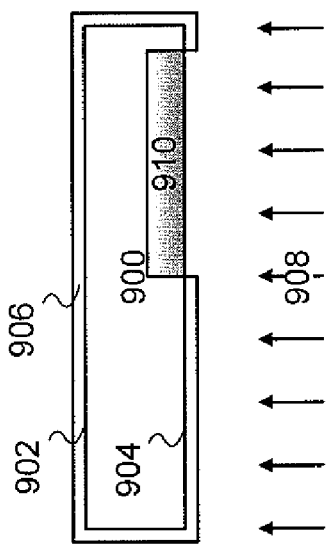

Thereafter, n-type particles 914 may be introduced to the grooves 918 (FIG. 9C). The n-type particles 914 may be particles containing phosphorous such as, for example, $H_3PO_4$. However, other n-type particles may also be used. In addition, the n-type particles 914 introduced to the grooves 918 and the n-type particles introduced to the form the n-type region 916 may be the same or different n-type particles. In the present disclosure the n-type particles 918 may be introduced to the grooves 918 via implantation or diffusion process. However, due to disadvantages associated with the diffusion process, the implantation process may be preferred.

Figure 9D:
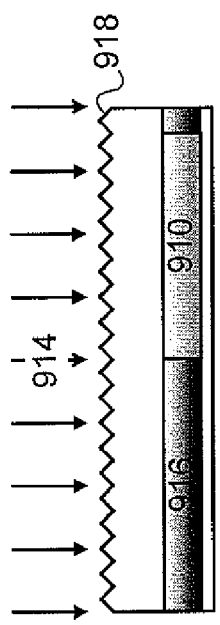

After introducing the n-type particles 914 to the grooves 918, an oxide layer 940 may then be formed on the grooves 918 (FIG. 9D). Anti-reflective coating 942, for example, a $Si_3N_4$ layer, may then be coated onto the oxide layer 940 (FIG. 9D).

Hereinafter, steps for forming contact regions 910a and 916a are provided. As illustrated in FIG. 9E, portions of the surface layer 906 disposed on the lower surface 904 may be removed, and a portion of the p-type region 910 and a portion of the n-type region 916 may be exposed. As noted above, the surface layer 906 may be removed via lithographic and etching processes or, alternatively, etching process using the patterned assembly. As illustrated in the FIG. 9E, each of the exposed p-type and n-type portions may be smaller than the respective p-type and n-type regions 910 and 916.

A patterned assembly 920 may then be disposed proximate to the lower surface 904 (FIG. 9F). The aperture 920a of the assembly 920 may be aligned with the exposed p-type portion 910a, whereas the assembly segment 940b may be aligned with the exposed n-type portion 916a. In one embodiment, the size of the each of the exposed p-type 910a and n-type 916a portion may be smaller than the size of the aperture 920a, as illustrated in FIG. 9F. In another embodiment, the size of the each of the exposed p-type 910a and n-type 916a portion may be equal to the size of the aperture 920a.

After the alignment, additional p-type particles 908 may be introduced to the exposed p-type portion 910a. In the process, p-type contact region 910a having higher p-type carrier concentration than the p-type region 910 may be formed (FIG. 9F). The p-type particles 908, however, may be prevented from being introduced to the exposed portion of the n-type region 916a by the patterned assembly segment 920b.

In the present disclosure, the p-type particles 908 may be introduced to the exposed portion of the p-type region via implantation or diffusion processes. In addition, the dose of the p-type particles 908 introduced to form the p-type contact region 910a may be less than, equal to, or greater than the dose of the p-type particles 908 introduced to form the p-type region 910. As such, the p-type contact region 910a may have much greater carrier concentration than the p-type region 910. The dose of the p-type particles 908 introduced to form the p-type contact region 910a may also be less than, equal to, or greater than the dose of the n-type particles 914 introduced to form the n-type region 916. As such, the p-type contact region 910a may also have much greater carrier concentration than the n-type region 916.

To form the n-type contact region 916a, the aperture 920a of the patterned assembly 920 may be aligned with the exposed n-type portion, whereas the assembly segment 940b is aligned with the p-type contact region 910a. Thereafter, additional n-type particles 914 may be introduced to the exposed n-type portion 916a. In the process, the n-type contact region 916a having higher n-type carrier concentration than the n-type region 916 may be formed (FIG. 9G). The n-type particles 914, however, may be prevented from being introduced to the p-type contact region 910a by the patterned assembly segment 920b.

In the present disclosure, the n-type particles 914 may be introduced to the exposed portion of the n-type region 916 via implantation or diffusion process. In addition, the dose of the n-type particles 914 introduced to form the n-type contact region 916a may be less than, equal to, or greater than the dose of the n-type particles 914 introduced to form the n-type region 916. In addition, the dose of the n-type particles 914 introduced to form the n-type contact region 916a may be less than, equal to, or greater than the dose of the p-type particles 908 introduced to form the p-type region 910 or the p-type contact region 910a.

In the present disclosure, alignment of the aperture and the assembly segment 920a and 920b with a desired region or exposed portion may be achieved by translating the assembly 920 relative to the solar cell 900. Alternatively, several assemblies 920 may be used. In particular, an assembly 920 having at least one aperture aligned with a particular region or portion may be used to form a particular type region or contact region. Thereafter, a different assembly having at least one aperture aligned with different region or portion may be used to form a different type region or contact region.

Those of ordinary skill in the art will recognize that the order of forming the contact regions 910a and 916a is not limited. As such, the n-type contact region 916a may be formed prior to forming the p-type contact region 910a.

In the present disclosure, the process for manufacturing the solar cell may also include at least one diffusion drive-in step such as, for example, rapid thermal processing ("RTP") or rapid thermal annealing ("RTA") to enhance uniform distribution of the introduced particles or impurities in the solar cell 900. The diffusion drive-in process may be performed after introducing particular particles. For example, the diffusion drive-in process may be performed after introducing the particles to form p-n junction; to process the upper surface; and/or to form contact regions.

After forming the p-type and n-type contact regions 910a and 916a, wires 980 may be formed on the contact regions 910a and 916a. In the present embodiment, the wires 980 may be formed via a process such as screen print lithographic process (FIG. 9H). After forming the wires, fired aluminum paste contact 982 may be formed on the first and second contact regions 910a and 916a.

Although the above embodiment includes use of surface layer 906, the patterned assembly 920 of the present disclosure may be used instead of or in addition to the surface layer 906 to selectively introduce the particles.

Referring to FIG. 10A-F, there is shown another exemplary method for manufacturing a solar cell 1000. Similar to the method disclosed earlier, the process of manufacturing the solar cell may include steps for forming/processing (1) a p-n junction, (2) a radiation receiving surface, and (3) a contact region, not necessarily in such order. For purpose of clarity and simplicity, steps or features similar to those disclosed earlier will be omitted.

Figure 10A:
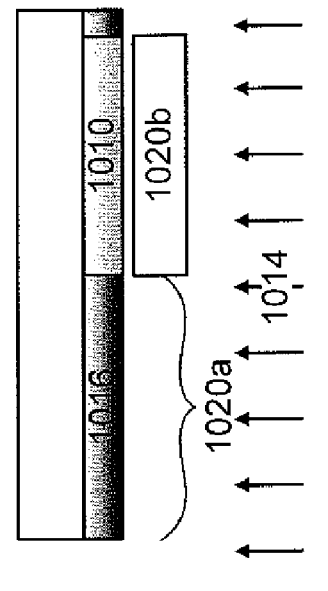
FIG. 10A-10G illustrate another method for manufacturing a solar cell according to another embodiment of the present disclosure.

Hereinafter, steps for forming a p-n junction are provided. As illustrated in FIG. 10A, a patterned assembly 1020 having at least an aperture 1020a and a patterned assembly segment 1020b may be positioned near the solar cell 1000. The solar cell 1000 may preferably be, for example, an n-type Si solar cell 1000. However, other types of solar cells may also be used. Unlike the solar cell 900 described with reference to FIG. 9, the solar cell of the present embodiment may initially be free of a surface layer 1006. In another embodiment, the surface layer 1006 may be disposed on the solar cell.

Figure 10B:
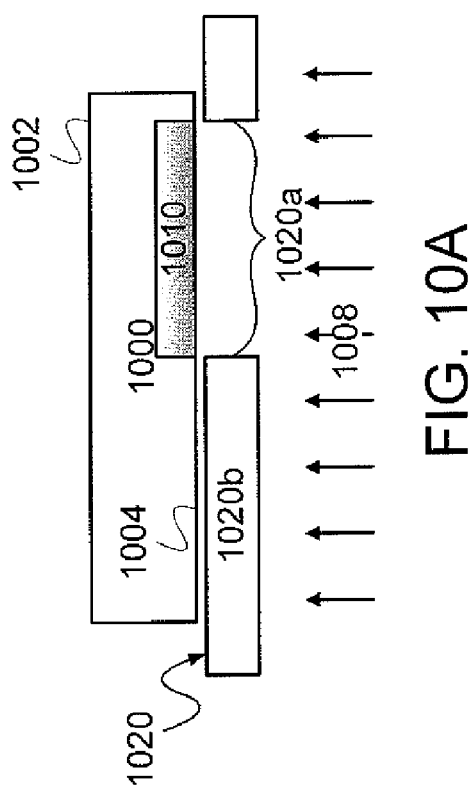

After positioning the patterned assembly 1020, p-type particles 1008 may be introduced to the solar cell 1000 via the aperture 1020a to form a p-type region 1010 (FIG. 10A). Meanwhile, the p-type particles 1008 may be prevented from being introduced to other regions (FIG. 10A). Thereafter, the patterned assembly 1020 may be disposed such that the aperture 1020a is aligned with region(s) adjacent to the p-type region 1010, whereas the assembly segment 1020b is aligned with the p-type region 1010 (FIG. 10B). N-type particles 1014 may then be introduced to the adjacent region(s), forming n-type region(s) 1016 adjacent to the p-type region 1010. Thus, a p-n junction may be formed. In the present disclosure, the dose of the n-type particles 1014 introduced to form the n-type region 1016 may be less than, equal to, or greater than the dose of the p-type particles 1008 introduced to form the p-type region 1010. As such, the n-type region 1016 may have equal or different particle or carrier concentration than the p-type region 1010.

In the present embodiment, the p-type region 1010 may preferably be formed prior to the forming the n-type region 1016. However, in another embodiment, the p-type region 1010 may be formed after forming the n-type region 1016. In addition, the particles may be introduced in the present embodiment via implantation process. Implantation of the particles may be preferable as the implantation may minimize isotropic diffusion of particles. However, in another embodiment, the particles may be introduced via a diffusion process. Yet in another embodiment, one type of particles may be introduced via implantation process, whereas another type of particles may be introduced via diffusion process.

Figure 10C:
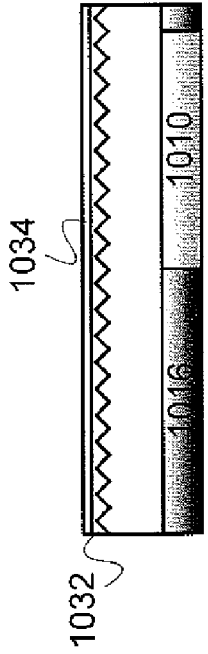

Hereinafter, steps for forming the radiation receiving surface are provided. Etching particles (not shown), for example, KOH, may be introduced to an upper surface 1002 of the solar cell 1000. The etching particle may preferably provide anisotropic etching to form a plurality of grooves 1018 (FIG. 10C). Thereafter, additional n-type particles 1014 may be introduced to the grooves 1018 (FIG. 10C). The n-type particles 1014 may be particles containing phosphorous such as, for example, $H_3PO_4$. However, other n-type particles may also be used. In addition, the n-type particles 1014 introduced to the grooves 1018 and the n-type particles introduced to the form the n-type region 1016 may be the same or different n-type particles. In the present disclosure the n-type particles 1018 may be introduced to the grooves 1018 via implantation or diffusion process. However, due to disadvantages associated with the diffusion process, the implantation process may be preferred.

Figure 10D:
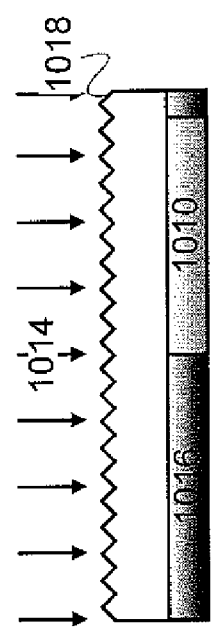

After introducing the n-types particles 1014 to the grooves 1018, an oxide layer 1032 may be formed on the grooves 1008 (FIG. 10D). On the oxide layer 1032, an antireflective layer 1034, for example, a $Si_3N_4$ layer, may be formed.

Figure 10E:
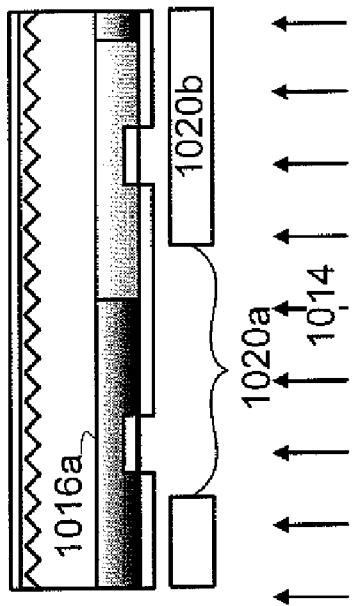

Hereinafter, steps for forming contact regions 1010a and 1016a are provided. On the lower surface 1004 of the solar cell 1000, a surface layer 1006 may be formed. As noted above, the surface layer may include, for example, a passivation layer, dielectric layer, a hard mask, a metal layer, a resist layer. After forming the surface layer 1006, portions of the surface layer 1006 may be removed (FIG. 10E). As noted in the earlier embodiment, the portions of the surface layer 1006 may be removed via lithographic and etching processes. Alternatively, the portions of the surface layer 1006 may be removed by disposing the patterned assembly and selectively removing the surface layer 1006 via, for example, etching process. By removing the portions of the surface layer 1006, a portion of the p-type region 1010 and a portion 1016*a* of the n-type region 1016 may be exposed. As illustrated in the FIG. 10E, each of the exposed p-type 1010*a* and n-type 1016*a* portions may be smaller than respective p-type 1010 and n-type 1016 regions. In one embodiment, the size of the each of the exposed p-type 1010*a* and n-type 1016*a* portion may be smaller than the size of the aperture 1020*a*, as illustrated in FIG. 10E. In another embodiment, the size of the each of the exposed p-type 1010*a* and n-type 1016*a* portion may be equal to the size of the aperture 1020*a*.

The patterned assembly 1020 may then be positioned proximate to the solar cell 1000 (FIG. 10E). The aperture 1020*a* of the assembly 1020 may be aligned with the exposed p-type portion, whereas the assembly segment 1040*b* may be aligned with the exposed n-type portion. After the alignment, additional p-type particles 1008 may be introduced to the exposed p-type portion 1010*a* (FIG. 10E). In the process, p-type contact region 1010*a* having higher p-type carrier concentration than the p-type region 1010 may be formed. The p-type particles 1008, however, may be prevented from being introduced to the exposed portion of the n-type region by the patterned assembly segment 1040*b*.

In the present disclosure, the p-type particles 1008 may be introduced via implantation or diffusion. In addition, the dose of the p-type particles 1008 introduced to form the p-type contact region 1010*a* may be less than, equal to, or greater than the dose of the p-type particles 1008 introduced to form the p-type region 1010. As such, the p-type contact region 1010*a* may have much greater carrier concentration than the p-type region 1010. The dose of the p-type particles 1008 introduced to form the p-type contact region 1010*a* may also be less than, equal to, or greater than the dose of the n-type particles 1014 introduced to form the n-type region 1016. As such, the p-type contact region 1010*a* may also have much greater carrier concentration than the n-type region 1016.

Figure 10F:
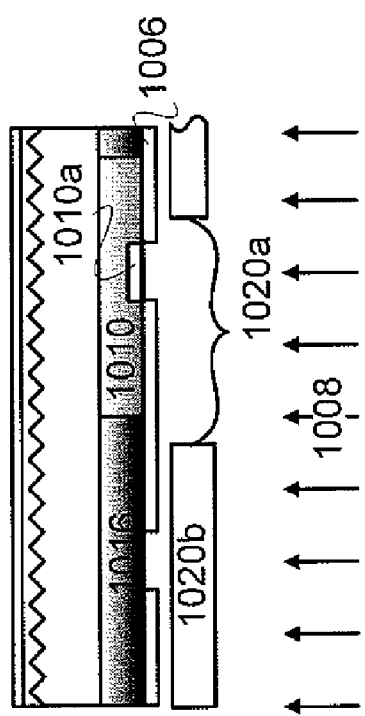

To form the n-type contact region 1016*a*, the aperture 1020*a* of the patterned assembly 1020 may be aligned with the exposed n-type portion, whereas the assembly segment 1020*b* is aligned with the p-type contact region 1010*a*. Thereafter, additional n-type particles 1014 may be introduced to the exposed n-type portion. In the process, the n-type contact region 1016*a* having higher n-type carrier concentration than the n-type region 1016 may be formed (FIG. 10F). The n-type particles 1014, however, may be prevented from being introduced to the p-type contact region 1010*a* by the patterned assembly segment 1040*b*.

In the present disclosure, the n-type particles 1014 may be introduced via implantation or diffusion process. In addition, the dose of the n-type particles 1014 introduced to form the n-type contact region 1016*a* may be less than, equal to, or greater than the dose of the n-type particles 1014 introduced to form the n-type region 1016. The dose of the n-type particles 1014 introduced to form the n-type contact region 1016*a* may also be less than, equal to, or greater than the dose of the p-type particles 1008 introduced to form the p-type region 1010 or the p-type contact region 1010*a*.

In the present disclosure, alignment of the aperture and the assembly segment 1020*a* and 1020*b* with desired region or exposed portion may be achieved by translating the assembly 1020 relative to the solar cell 1000. Alternatively, several assemblies 1020 may be used. In particular, an assembly 1020 having at least one aperture aligned with a particular region or portion may be used to form a particular type region or contact region. Thereafter, a different assembly 1020 having at least one aperture aligned with different region or portion may be used to form a different type region or contact region.

Those of ordinary skill in the art will recognize that the order of forming the contact regions 1010*a* and 1016*a* is not limited. As such, the n-type contact region 1020*a* may be formed prior to forming the p-type contact region 1010*a*.

In the present disclosure, the process for manufacturing the solar cell may also include at least one diffusion drive-in step such as, for example, RTP or RTA process to enhance uniform distribution of the introduced particles or impurities in the solar cell 1000. The diffusion drive-in process may be performed after introducing particular particles. For example, the diffusion drive-in process may be performed after introducing the particles to form p-n junction; to process the upper surface; and/or to form contact regions.

Figure 10G:
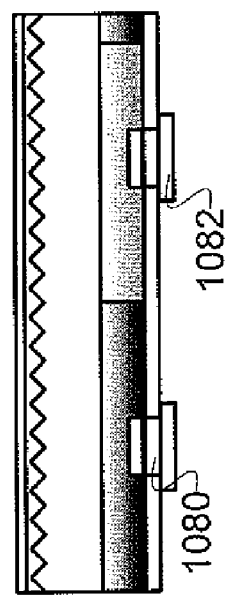

After forming the p-type and n-type contact regions 1010*a* and 1016*a*, wires 1080 may be formed on the contact regions 1010*a* and 1016*a*. In the present embodiment, the wires 1080 may be formed via a process such as screen print lithographic process (FIG. 10G). After forming the wires 1080, fired aluminum paste contact 1082 may be formed on the first and second contact regions 1010*a* and 1016*a*.

Although the above embodiment includes use of surface layer 1006, the patterned assembly 1020 of the present disclosure may be used instead of or in addition to the surface layer 1006 to selectively introduce the particles.

Systems and methods for introducing and controlling introduction of the particles to a particular region of the solar cell are disclosed. Although the present disclosure has been described herein in the context of particular solar cell manufacturing systems, particular types of particle source, particular types of solar cell, particular implementations in particular environments for a particular purpose, the present disclosure is not limited thereto. Those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

What is claimed is:

1. A method for manufacturing a solar cell, comprising:
   introducing a first dopant to a first region of said solar cell;
   implanting a second region of said solar cell with a second dopant using a patterned assembly disposed a distance from said solar cell;
   annealing said solar cell; and
   depositing an anti-reflective coating on said solar cell.

2. The method of claim 1, wherein said second region is smaller than said first region.

3. The method of claim 1, wherein said introducing is selected from the group consisting of diffusion and ion implantation.

4. The method of claim 1, wherein said first dopant and said second dopant are the same.

5. The method of claim 1, wherein said first dopant and said second dopant are selected from the group consisting of B and P.

6. The method of claim 1, wherein said second region is interior to said first region.

7. The method of claim 1, wherein said second region is a contact region.

8. The method of claim 7, further comprising applying a wire to said second region.

9. The method of claim 8, wherein said applying comprises a screen print lithographic process.

10. A method for manufacturing a solar cell, comprising:
 implanting a first region of said solar cell with a first dopant;
 implanting a second region of said solar cell with a second dopant using a patterned assembly disposed a distance from said solar cell, said second region being inside said first region;
 annealing said solar cell;
 forming an oxide layer on said solar cell; and
 depositing an anti-reflective coating on said solar cell.

11. The method of claim 10, wherein said first dopant and said second dopant are selected from the group consisting of B and P.

12. The method of claim 10, wherein said second region is a contact region.

13. The method of claim 12, further comprising applying a wire to said second region.

14. The method of claim 13, wherein said applying comprises a screen print lithographic process.

15. A method for manufacturing a solar cell, comprising:
 implanting a first region of said solar cell with a first dopant using a patterned assembly disposed a distance from said solar cell;
 implanting a second region of said solar cell with a second dopant using a second patterned assembly disposed a distance from said solar cell, said second region adjacent said first region; and
 annealing said solar cell.

16. The method of claim 15, wherein said first dopant and said second dopant are selected from the group consisting of B and P.

17. The method of claim 15, further comprising applying at least one wire to said first region and said second region using a screen print lithographic process.

18. The method of claim 15, further comprising implanting a first contact region of said first region with said first dopant and implanting a second contact region of said second region with said second dopant.

19. The method of claim 15, further comprising forming an oxide layer on said solar cell.

20. The method of claim 15, wherein said second patterned assembly is the same as said patterned assembly.

* * * * *